United States Patent [19]

Dworkin et al.

[11] Patent Number: 5,604,691

[45] Date of Patent: Feb. 18, 1997

[54] LOGARITHM/INVERSE-LOGARITHM CONVERTER UTILIZING A TRUNCATED TAYLOR SERIES AND METHOD OF USE THEREOF

[75] Inventors: James D. Dworkin, Chandler; John M. Buss, Tempe, both of Ariz.

[73] Assignee: Motorola, Inc., Schaumburg, Ill.

[21] Appl. No.: 381,167

[22] Filed: Jan. 31, 1995

[51] Int. Cl.$^6$ .............................. G06F 7/00; G06F 15/00; G06F 1/02; H03M 7/50
[52] U.S. Cl. ..................... 364/722; 364/748.5; 341/75; 395/800
[58] Field of Search ........................... 364/722, 748, 364/748.5, 715.03, 736; 341/75; 395/800

[56] References Cited

U.S. PATENT DOCUMENTS

| | | | |
|---|---|---|---|
| 4,555,768 | 11/1985 | Lewis, Jr. et al. | 364/757 |
| 4,922,212 | 5/1990 | Roberts et al. | 331/176 |
| 5,301,138 | 4/1994 | Lindsley | 364/748.5 |
| 5,331,582 | 7/1994 | Sudo et al. | 364/722 |
| 5,343,254 | 8/1994 | Wada et al. | 348/627 |

FOREIGN PATENT DOCUMENTS

WO93/17383  9/1993  WIPO .............................. G06F 7/52

OTHER PUBLICATIONS

A Logarithmic Vector Processor for Neural Net Applications by Steve Richfield, Neurosoft, IEEE First International Conference on Neural Networks, Sheraton Harbor Island East, San Diego, California, Jun. 21–24, 1987.

A Multiplier–Less Digital Neural Network by L. Spaaneburg, B. Hoefflinger, S. Neusser, J. A. G. Nijhuis, A. Siggelkow, IMS, Stuttgart, Germany, Proceedings of the 2nd Int'l Conference on Microelectronics for Neural Networks, Oct. 16–18, 1991, Munich, F.R. Germany.

Algorithm Design for a 30 bit Integrated Logarithmic Processor by David M. Lewis and Lawrence K. Yu, Department of Electrical Engineering, University of Toronto, Proceeding 9th Symposium on Computer Arithmetic, 1989, IEEE Comp. Soc. Press, pp. 192–19.

An Architecture for Addition and Subtraction of Long Word Length Numbers in the Logarithmic Number System by David M. Lewis, Member, IEEE, IEEE Transactions on Computers, vol. 39, No. 11, Nov. 1990, pp. 1325–1336.

A 30–b Integrated Logarithmic Number System Processor by Lawrence K. Yu, Member, IEEE, and David M. Lewis, Member, IEEE, IEEE Journal of Solid–State Circuits, vol. 26, No. 10, Oct. 1991, pp. 1433–1440.

An Accurate LNS Arithmetic Unit Using Interleaved Memory Function Interpolator by David M. Lewis, Department of Electrical Engineering, University of Toronto, Proceeding 11th Symposium on Computer Arithmetic, 1993, IEEE Comp. Soc. Press, pp. 2–9.

Interleaved Memory Function Interpolators with Application to an Accurate LNS Arithmetic Unit by David M. Lewis, Member, IEEE, IEEE Transactions on Computers, vol. 43, No. 8, Aug. 1994, pp. 974–982.

Table–Lookup Algorithms for Elementary Functions and Their Error Analysis by Ping Tak Peter Tang, Mathematics and Computer Schience Division, Argonne National Laboratory, 9700 S. Cass. Ave., Argonne, IL 60439–4801, Proceeding 10th Symposium on Computer Arithmetic, Jun. 1991, pp. 232–236.

(List continued on next page.)

*Primary Examiner*—Roy N. Envall, Jr.
*Assistant Examiner*—Emmanuel L. Moise
*Attorney, Agent, or Firm*—Michael K. Lindsey

[57] ABSTRACT

A converter which may be used for implementing either logarithmic or inverse-logarithmic functions is disclosed. The converter includes a memory, two multiplier, and two adders. The memory stores a plurality of coefficient which are based on a second-order Taylor polynomial used to estimate a logarithmic or inverse-logarithmic function over a domain of input values. A method of using the converter is also disclosed.

40 Claims, 5 Drawing Sheets

OTHER PUBLICATIONS

Applying Features of IEEE 754 to Sign/Logarithm Arithmetic by Mark G. Arnold, Member, IEEE, Thomas A. Bailey, Member, IEEE, John R. Cowles, and Mark D. Winkel, IEEE Transactions on Computers, vol. 41, No. 8, Aug. 1992, p. 1040–1050.

D8.13 Improved Accuracy for Logarithmic Addition in DSP Applications by Mark G. Arnold, John Cowles, and Thomas Bailey, Computer Science Department, University of Wyoming, Laramie, WY, ICASSP 88: Int. Conf. on Acoustics, Speech and Signal Processing, vol. 3 pp. 1714–1717.

Redundant Logarithmic Number Systems by M. G. Arnold, T.A. Bailey, J. R. Cowles, J. J. Cupal, University of Wyoming, Laramie, WY, Proceeding of 9th Symposium on Computer Arithmetic, pp. 144–151, IEEE Comp. Soc. Press.

Comments on "An Architecture for Addition and Subtraction of Long Word Length Numbers in the Logarithmic Number System" [1] by M. Arnold, T. Bailey and J. Cowles, IEEE Transactions on Computers, vol. 41, No. 6, Jun. 1992, pp. 786–788.

Redundant Logarithmic Arithmetic, Mark G. Arnold, Member IEEE, Thomas A. Bailey, Member IEEE, John R. Cowles, and Jerry J. Cupal, Members IEEE, IEEE Transactions on Computers, vol. 39, No. 8, Aug. 1990, pp. 1077–1086.

Computation of the Base Two Logarithm of Binary Numbers by M. Combet et al., IEEE Transactions on Electronic Computers, vol. EC 14, No. 6, Dec. 1963.

LOGARITHM/INVERSE-LOGARITHM CONVERTER UTILIZING A TRUNCATED TAYLOR SERIES AND METHOD OF USE THEREOF

RELATED INVENTIONS

The present invention is related to the following inventions which are assigned to the same assignee as the present invention:

(1) "Logarithm/Inverse-Logarithm Converter and Method of Using Same", having Ser. No. 08/381,368, filed on Jan. 31, 1995.

(2) "Logarithm/Inverse-Logarithm Converter Utilizing a Second-order Term and Method of Using Same", having Ser. No. 08/382,467, filed on Jan. 31, 1995.

(3) "Logarithm/Inverse-Logarithm Converter Utilizing Linear Interpolation and Method of Using Same", having Ser. No. 08/391,880, filed on Feb. 22, 1995.

(4) "Neural Network Utilizing a Logarithmic Function and Method of Using Same", having Ser. No. 08/176,601, filed on Dec. 31, 1993.

(5) "Computer Processor Utilizing Logarithmic Conversion and Method of Use Thereof", having Ser. No. 08/403,158, filed on Mar. 13, 1995.

The subject matter of the above-identified related inventions is hereby incorporated by reference into the disclosure of this invention.

TECHNICAL FIELD

The present invention relates generally to computing circuits and, in particular, to a computing circuit which may be used to perform either a logarithmic or inverse-logarithmic conversion on an input value.

BACKGROUND OF THE INVENTION

Logarithmic converters are devices used to implement logarithmic functions and are most commonly found in items such as hand-held calculators and spread sheet software programs. Logarithmic functions, or log functions, belong to a class of mathematical functions called transcendental functions which are important in wide variety applications such as data communications, control systems, chemical processes, and computer simulation. A log function is abbreviated with the following mathematical equation: $y=\log_b(x)$. In this equation, x represents an input value which may be any number greater than or equal to zero; b represents a base number system; and y represents a logarithm value, or log value, which corresponds to the input value x.

Inverse-log converters are devices used to implement inverse-logarithmic, or inverse-log, functions. Essentially, an inverse-log function is the reverse of a log function. What is meant by "reverse" is explained in the following discussion. A log function converts an input value, x, which is in a domain of input value into a definite log value which is in a range of log values. Basically, the log function establishes a one-to-one correspondence between input values in the domain and log values in the range. This correspondence is represented symbolically by x→y. An inverse-log function establishes a reverse correspondence between log values and input values which is represented by y→x. An inverse-log function is abbreviated with either of the following equivalent mathematical equations: $y=\log_b^{-1}(x)$ or $y=b^x$. In these equations, x represents an input value; b represents a base number system; and y represents an inverse-log value which corresponds to the input value x and may be any number greater than or equal to zero. Like log functions, inverse-log functions are important in a wide variety applications.

Two techniques of computing log and inverse-log values are commonly used today. Both techniques are analogously used to compute either log or inverse-log values; thus, for the sake of brevity, the following discussion will focus on using the techniques to compute log values, with the understanding that the techniques may be used in a like manner to compute inverse-log values.

The first technique involves storing a corresponding log value in a look-up table for every possible input value. This approach allows a log value to be computed relatively quickly and is practical for applications requiring limited precision and having input values within a small domain. However, in many applications this technique is impractical because it requires too great a memory space to store the look-up table. For example, in a digital system using an IEEE standard 32-bit floating point number, which has a 23-bit mantissa, such a look-up table would be required to store $2^{23}$ log values—one for every possible mantissa value. A computer memory for storing this number of log values would be prohibitively expensive, if not impossible, to build.

The second technique of computing log values involves computing a power series to approximate a log function. An example of a power series which approximates a log function is given as:

$$y=\text{Log}(1+x)=x-x^2/2+x^3/3-x^4/4+ \tag{1}$$

In this example, the log function is a specific type of log function known as a natural logarithm, which is widely used in science and engineering applications. The variables in Equation 1 are defined as follows: y represents a log value, and x represents an input value in the domain $-1 \leq x < 1$. Although the technique of using a power series to approximate a log function allows a log value to be computed with a high degree of precision, it requires a large number of computer operations and therefore requires a relatively long period of time to execute. In other words, this technique is generally slow and negatively affects the throughput of a computer.

In summary, there is a need for a converter which can perform either a log or an inverse-log function quickly, thus allowing a computer to operate with greater throughput. Such a converter should also reduce the amount of memory space required to perform the conversions, and it should produce log or inverse-log values which have a high degree of precision.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF A PREFERRED EMBODIMENT

It is an advantage of the present invention to provide a converter which can be used to perform either a logarithmic or inverse-logarithmic conversion in a computer, processor or circuit, without altering the design of the converter. A further advantage of the present invention is that it provides a converter which computes log and inverse-log values with a high degree of precision. Yet another advantage of the present invention is that it provides a converter which requires a significantly reduced amount of memory space and may be efficiently implemented in an integrated circuit which consumes little power. An additional advantage of the present invention is to provide a method of using the converter to produce either log or inverse-log values.

Generally, the present invention provides a converter for computing either a log or an inverse-log functions. The converter comprises a memory and an arithmetic means. The memory stores a plurality of coefficients, wherein the coefficients are calculated using a Taylor polynomial, also referred to as a truncated Taylor series, to estimate either a log or an inverse-log function over a domain of input values. The arithmetic means generates a log or an inverse-log value, depending on the coefficients stored in the memory, by performing arithmetic operations on an input value and ones of the coefficients.

The converter may be easily re-configured to perform either log or inverse-log functions, or functions having a different base number system or domain of input values, by loading the memory with a different set of coefficients.

Figure 1:
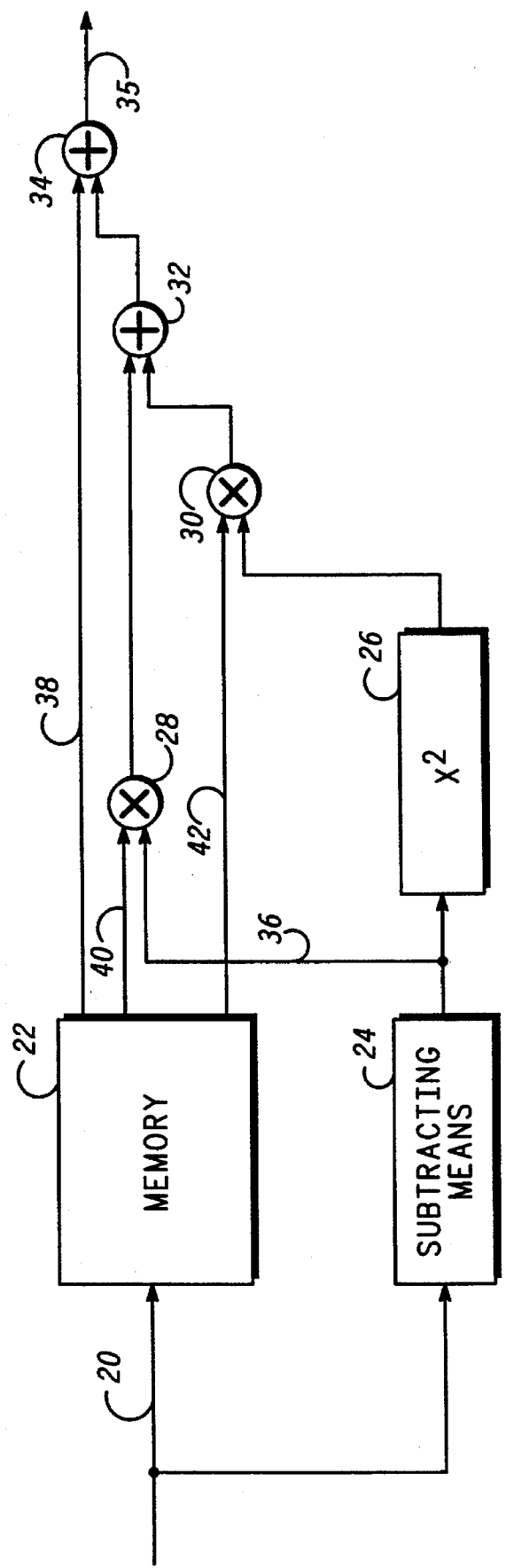
FIG. 1 illustrates a logarithm/inverse-logarithm converter in accordance with a preferred embodiment of the present invention.

FIG. 1 illustrates a logarithm/inverse-logarithm converter in accordance with a preferred embodiment of the present invention. The converter comprises a memory 22, a first multiplier 28, a second multiplier 30, a subtracting means 24, a squaring means 26, a first adder 32, and a second adder 34. The memory 22 stores a plurality of coefficients. The coefficients are based on a second-order Taylor polynomial and they include a zero-order coefficient, a first-order coefficient, and a second-order coefficient.

The converter operates as follows. An input value 20 provides an address which is used to retrieve a set of coefficients. Additionally, the set of coefficients includes the zero-order, first-order, and second-order coefficients which are located in the memory 22 at a common address which corresponds to the input value 20. The subtracting means 24 subtracts a base point value from the input value 20 to produce an interval value 36. The squaring means 26 squares the interval value 36 to produce a squared interval value. In one embodiment of the present invention, the squaring means 26 includes a square multiplier which produces the squared interval value in response to receiving the interval value. In another embodiment, the squaring means 26 includes a read-only-memory for producing the squared interval value in respond to receiving the interval value. The first multiplier 28 multiplies the interval value 36 by the first-order coefficient 40 to produce a first-order term. The second multiplier 30 multiplies the squared interval value by the second-order coefficient 42 to produce a second-order term. The first adder 32 sums the first-order term and the second-order term to produce a first sum. The second adder 34 sums the first sum and the zero-order coefficient 38 to produce the output value 35.

In one embodiment of the present invention, the converter is implemented with an integrated circuit. However, one of ordinary skill will recognize that a programmable logic array, application specific integrated circuit (ASIC), or other digital logic device, as well as software running on a processor such as a microprocessor could also be used to implement the converter.

Figure 2:
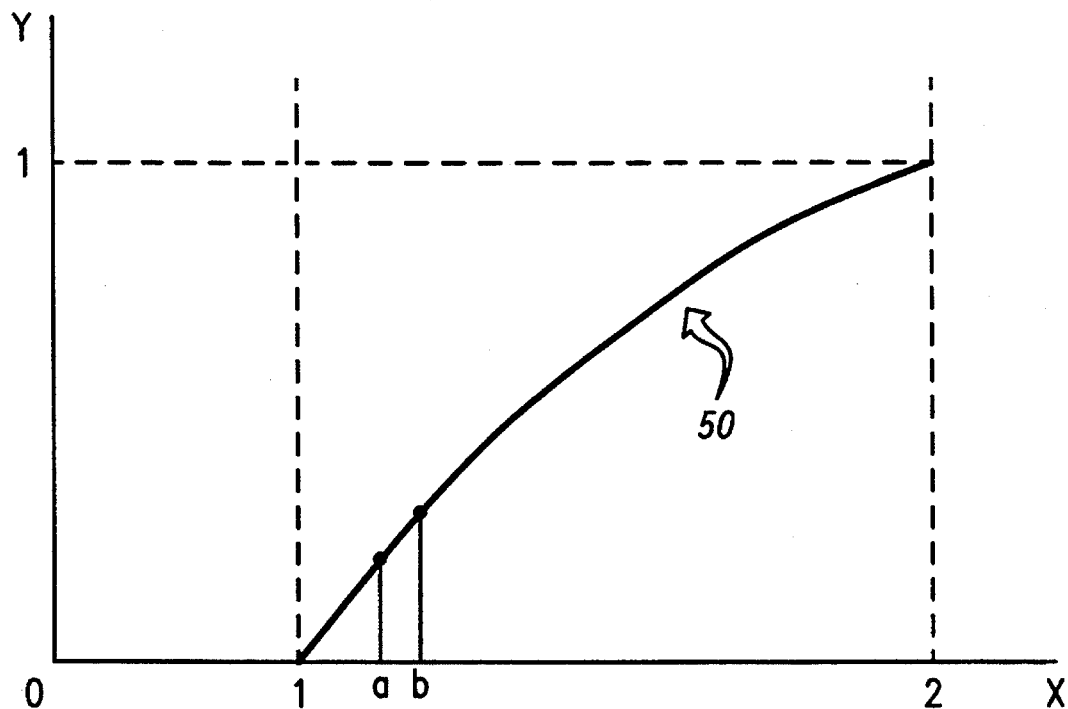
FIG. 2 shows a graph of a logarithmic function.

FIG. 2 shows a graph of a logarithmic function 50 over a domain of input values. The input values are given along the x-axis and the log values are given along the y-axis. The domain of the input values is 1 to 2, and the range of the log values is 0 to 1. An interval within the range is bounded by a pair of base points. An example interval is indicated with vertical dotted lines at base points a and b. Each base point in the domain corresponds to a location in the memory 22 which contains the Taylor coefficients computed at the base point. The log function 50 uses a base number system of two.

Figure 3:
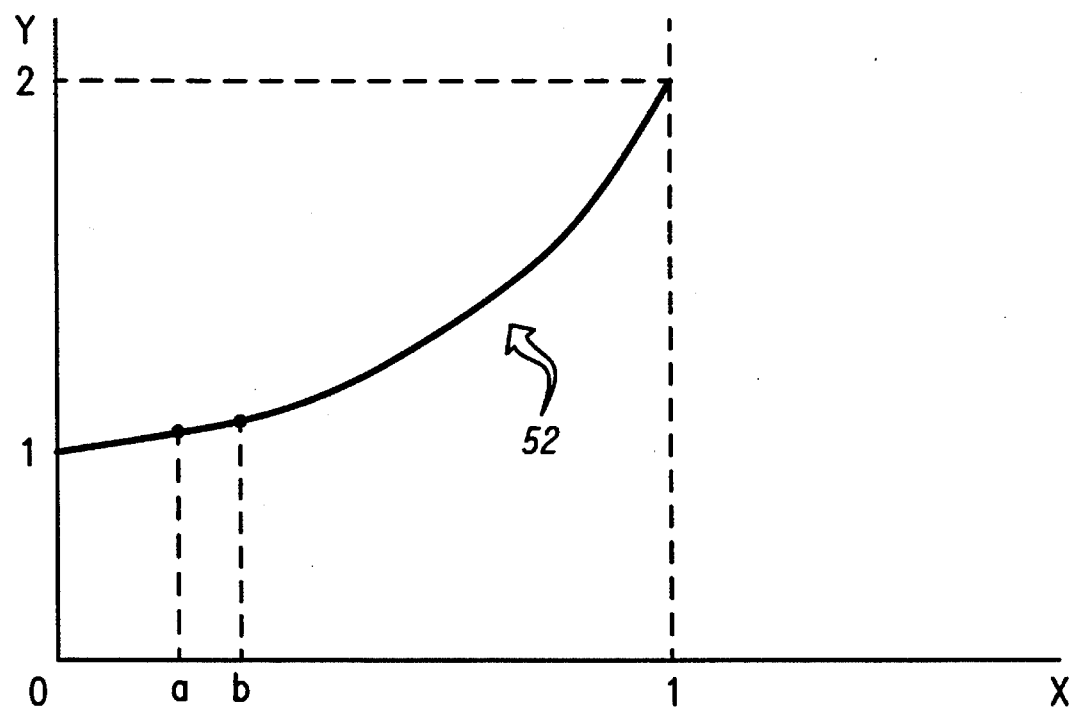
FIG. 3 shows a graph of an inverse-logarithmic function.

FIG. 3 shows a graph of an inverse-logarithmic function 52 over a domain of input values. The input values are given along the x-axis and the inverse-log values are given along the y-axis. The domain of the input values is 0 to 1, and the range of the inverse-log values is 1 to 2. An interval within the range is bounded by a pair of base points. An example interval is indicated with vertical dotted lines at base points a and b. Each base point in the domain corresponds to a location in the memory 22 which contains the Taylor coefficients computed at the base point. The inverse-log function 52 also uses a base two number system.

One of ordinary skill in the art will realize that the converter of the present invention may be used for computing any log or inverse-log function; however, in a preferred embodiment of the present invention, the converter computes the log function depicted in FIG. 2 and the inverse-log function depicted in FIG. 3.

An IEEE standard 32-bit floating point number may be easily converted to a log or an inverse-log value using the converter shown is FIG. 1. An IEEE 32-bit floating point value has one sign bit, a 23-bit mantissa, and an 8-bit exponent. Only the mantissa is provided to the converter as the input value 20. Both the sign bit and exponent bypass the converter and are later combined with the output value 48. Essentially, the converter computes either $y=\log_2(1.M)$ or $y=\log_2^{-1}(1.M)$, where y represents the output value and M represents the mantissa. The exponent of the floating point number is a base-two value, $2^e$, where e represent the exponent. A log or an inverse-log value corresponding to the floating point input is generated by summing of the output value 35 and the exponent, following conversion of the mantissa. This summation results in a value represented in a number format which includes an j-bit fractional portion and an k-bit integer portion. The integer values j and k may vary, depending on the desired precision of the converter.

Figure 4:
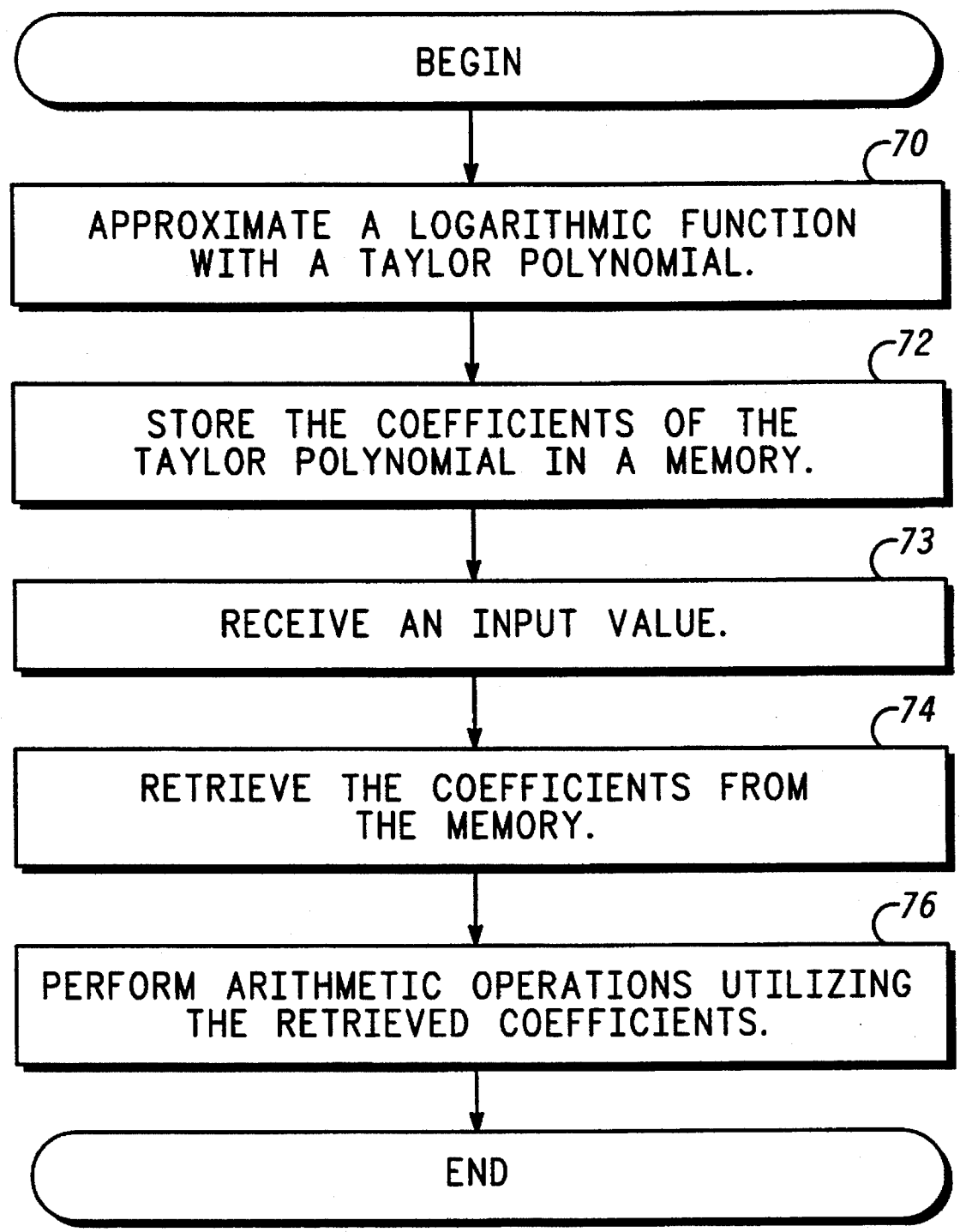
FIG. 4 illustrates a flow chart diagram of a method of using the logarithm/inverse-logarithm converter shown in FIG. 1.

FIG. 4 illustrates a flow chart diagram of a method of using the logarithm/inverse-logarithm converter shown in FIG. 1. The method may be used for generating either a log value or an inverse-log value. In box 70, a log (or inverse-log) function is approximated with a second-order Taylor polynomial having a plurality of coefficients. The plurality of coefficients include a zero-order, first-order, and second-order coefficient. Next, in box 72, the coefficients are stored in the memory 22. In box 73, an input value 20 is received. Next, in box 74, coefficients which correspond to the input value 20 are retrieved from the memory 22.

In box 76, arithmetic operations are performed on the retrieved coefficients and the input value 20 to produce the output value 35. Details of the arithmetic operations are given below with reference to FIG. 5. The retrieved coefficients include the zero-order coefficient 38, the first-order coefficient 40, and the second-order coefficient 42.

Referring to box 70, the log and inverse-log functions are approximated with a second-order Taylor polynomial having a general form:

$$y=f(a)+f'(a)*(x-a)+(f''(a)/2)*(x-a)^2 \quad (2)$$

where y represents the log (or inverse-log) value; f(a) represents the zero-order coefficient, which is the value of the log (or inverse-log) function at base point a; f'(a) represents the first-order coefficient, which is the value of the first derivative of the function at base point a; f''(a)/2 represents the second-order coefficient, which is one half the value of the second derivative of the function at base point a; x–a represents the interval value, and x represents an input value.

Figure 5:
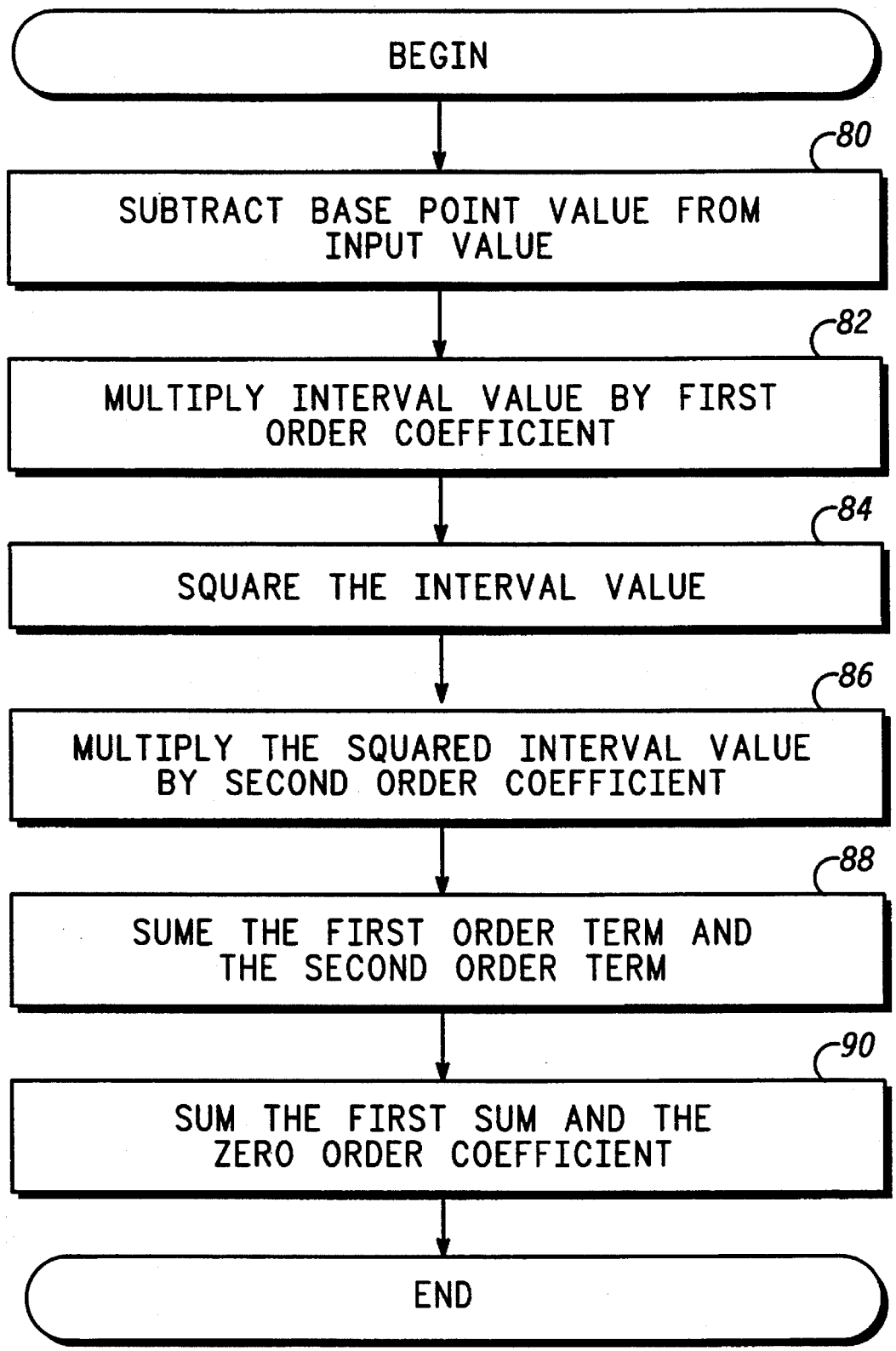
FIG. 5 illustrates a flow chart diagram of a method of performing arithmetic operations which is used by the logarithm/inverse-logarithm converter shown in FIG. 1.

FIG. 5 illustrates a flow chart diagram of a method of performing arithmetic operations which is used by the logarithm/inverse-logarithm converter shown in FIG. 1. In box 80, a base point value is subtracted from the input value to produce an interval value. In box 82, the interval value is multiplied by the first-order coefficient to produce a first-order term. Next, in box 84, the interval value is squared to produce a squared interval value. In box 86, the squared interval value is multiplied by the second-order coefficient to produce a second-order term. Next, in box 88, the first-order term and the second-order term are summed to produce a first sum. In box 90, the first sum and the zero-order coefficient are summed to produce the output value.

Figure 6:
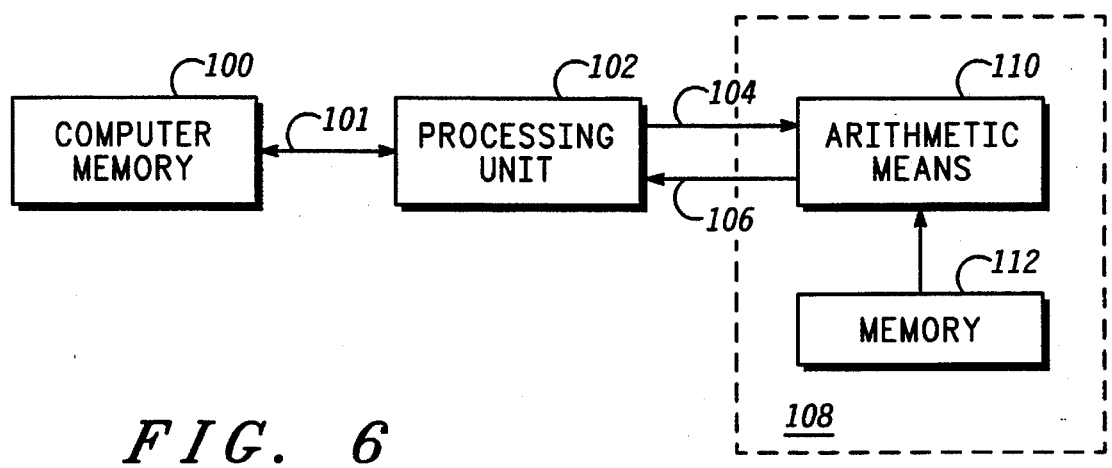
FIG. 6 illustrates one version of a computing device which incorporates an embodiment of the present invention.

FIG. 6 illustrates one version of a computing device which incorporates an embodiment of the present invention. The computing device comprises a processing unit 102 for executing a computer operation which utilizes a log/inverse-log value 106; a computer memory 100 for storing a computer program which includes the computer operation; a bus 101 connecting the processing unit 102 and the computer memory 100; and a converter 108 which receives an input value 104.

The converter 108 may include the converter shown in FIG. 1. In the example shown, the converter 108 includes a memory 112 and an arithmetic means 110 which is operatively coupled to the memory 112. The arithmetic means receives the input value 104 from the processing unit 102 and, in turn, generates either a log value or an inverse-log value depending on the coefficients stored in the memory 112.

Figure 7:
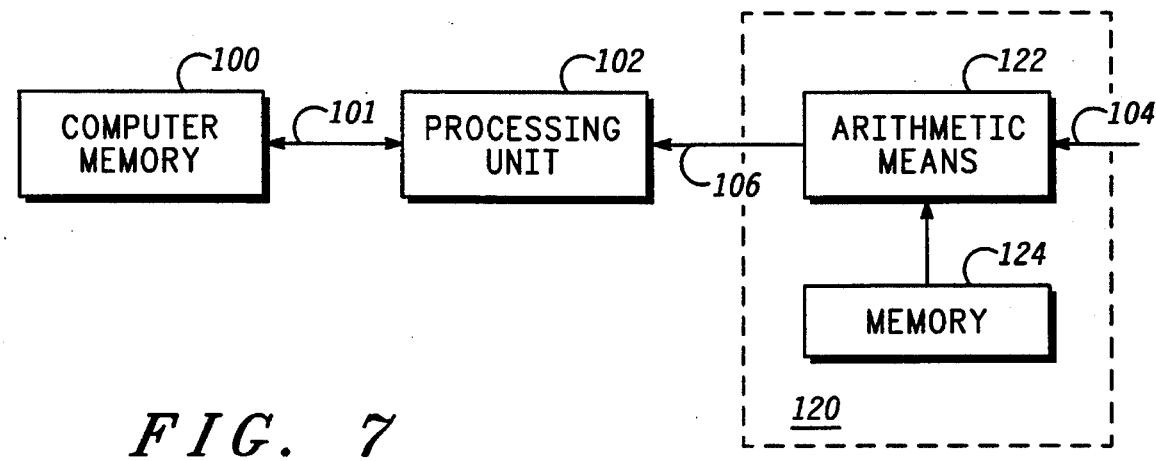
FIG. 7 illustrates another version of a computing device which incorporates an embodiment of the present invention.

FIG. 7 illustrates another version of a computing device which incorporates an embodiment of the present invention. The computing device comprises a processing unit 102 for executing a computer operation which utilizes a log/inverse-log value 106; a computer memory 100 for storing a computer program which includes the computer operation; a bus 101 connecting the processing unit 102 and the computer memory 100; and a converter 120 which receives an input value 104.

The converter 120 may include the converter shown in FIG. 1. In the example shown, the converter 120 includes a memory 124 and an arithmetic means 122 which is operatively coupled to the memory 124. The arithmetic means 122 receives the input value 104 and, in turn, generates either a log value or an inverse-log value depending on the coefficients stored in the memory 124.

Thus there has been described herein a concept, as well as a preferred embodiment, of a converter which may be used to compute either log or inverse-log functions. Because the embodiment of the converter as herein-described utilizes a Taylor polynomial to approximate a function it can perform either a log or inverse-log conversion using single adder, a single multiplier, and a look-up table which allows a significant reduction in memory size. Such a converter allows both improved data throughput and computation precision with a vast reduction in the cost and complexity of implementation, whether on a semiconductor chip or in a computer program.

While the various embodiments of the present invention have been described in terms of the processing of an input value into an output value, the present invention should be construed to include circuits and methods implemented by these circuits for processing an input signal representative of the input value into an output signal representative of the output value.

While specific embodiments of the present invention have been shown and described, it will be apparent to those skilled in the art that the disclosed invention may be modified in numerous ways and may assume many embodiments other than the preferred form specifically set out and described above.

Accordingly, it is intended by the appended claims to cover all modifications of the invention which fall within the true spirit and scope of the invention.

What is claimed is:

1. A method for generating a log value, which method comprises the following steps:

receiving an input value;

retrieving from a memory a plurality of coefficients based on a second-order Taylor polynomial that approximates a logarithmic function, the plurality of coefficients including a zero-order coefficient, a first-order coefficient, and a second-order coefficient;

subtracting a base point value from the input value to produce an interval value;

squaring the interval value by the first-order coefficient to produce a first-order term;

multiplying the interval value to produce a squared interval value;

multiplying the squared interval value by the second-order coefficient to produce a second-order term;

summing the first-order term and the second-order term to produce a first sum; and summing the first sum and the zero-order coefficient to produce the log value.

2. The method of claim 1, wherein the at least one coefficient is based on an expression having a form:

$$c=f^{(n)}(a)/n!$$

wherein c represents a coefficient value, $f^{(n)}(a)$ represents an $n^{th}$ derivative of the logarithmic function, a represents the input value, and n is an integer.

3. The method of claim 1, further comprising the following steps:

calculating a plurality of coefficients by using a Taylor polynomial to approximate the logarithmic function; and storing the plurality of the coefficients in the memory.

4. The method of claim 3, wherein the step of calculating includes the following substeps:

selecting a domain of input values for the logarithmic function;

selecting a plurality of base points within the domain; and for each of the base points, calculating a corresponding plurality of coefficients.

5. A logarithm converter, which comprises:

a memory for storing a plurality of coefficients that include a zero-order coefficient, a first-order coefficient, and a second-order coefficient, wherein the coefficients are based on a second-order Taylor polynomial which approximates a logarithmic function over a domain of input values;

a first multiplier for multiplying an interval value by the first-order coefficient to produce a first-order term;

means for squaring the interval value to produce a squared interval value;

a second multiplier for multiplying the squared interval value by the second-order coefficient to produce a second-order term;

a first adder for summing the first-order term and the second-order term to produce a first sum; and a second adder for summing the first sum and the zero-order coefficient to produce the log value.

6. The logarithm converter of claim 5, wherein each of the plurality of coefficients is based on an expression having a form:

$$c = f^{(n)}(a)/n!$$

wherein c represents a coefficient, $f^{(n)}(a)$ represents an $n^{th}$ derivative of the logarithmic function, a represents the input value, and n is an integer.

7. The logarithm converter of claim 5, further comprising:

means for subtracting a base point value from the input value to produce the interval value.

8. The logarithm converter of claim 5, wherein the squaring means includes:

a square multiplier which produces the squared interval value in response to receiving the interval value.

9. The logarithm converter of claim 5, wherein the squaring means includes:

a read-only-memory for producing the squared interval value in respond to receiving the interval value.

10. The logarithm converter of claim 5, wherein the input value is a binary value having a plurality of bits used to retrieve from the memory the ones of the plurality of coefficients.

11. A logarithm converter for generating a log value corresponding to an input value, the logarithm converter comprising:

a first memory for storing a plurality of coefficient sets, wherein each of the coefficient sets is based on a second-order Taylor polynomial which approximates a logarithmic function at a base point within a domain of input values, the memory providing as output a coefficient set corresponding to the input value, wherein the coefficient set includes a zero-order coefficient, a first-order coefficient and a second-order coefficient;

a first multiplier for multiplying an interval value by the first-order coefficient to produce a first-order term;

a second memory for producing a squared interval value in response to receiving the interval value;

a second multiplier for multiplying the squared interval value by the second-order coefficient to produce a second-order term;

a first adder for summing the first-order term and the second-order term to produce a first sum; and a second adder for summing the first sum and the zero-order coefficient to produce the log value.

12. The logarithm converter of claim 11, further comprising:

means for subtracting a base point value from the input value to produce the interval value.

13. The logarithm converter of claim 11, wherein the zero-order coefficient, the first-order coefficient, and the second-order coefficient are based on an expression having a form:

$$c = f^{(n)}(a)/n!$$

wherein c represents a coefficient, $f^{(n)}(a)$ represents an $n^{th}$ derivative of the logarithmic function, a represents the input value, and n is an integer.

14. The logarithm converter of claim 11, wherein the input value is a binary value having a plurality of bits used to retrieve the coefficient set from the memory.

15. A computing device, which comprises:

a processing unit for executing a computer operation which utilizes a log value;

a computer memory for storing a computer program which includes the computer operation;

a logarithm converter which receives an input value and includes:

a memory for storing a plurality of coefficients that include a zero-order coefficient, a first-order coefficient, and a second-order coefficient, wherein the coefficients are based on a second-order Taylor polynomial which approximates a logarithmic function over a domain of input values;

a first multiplier for multiplying an interval value by the first-order coefficient to produce a first-order term;

means for squaring the interval value to produce a squared interval value;

a second multiplier for multiplying the squared interval value by the second-order coefficient to produce a second-order term;

a first adder for summing the first-order term and the second-order term to produce a first sum; and a second adder for summing the first sum and the zero-order coefficient to produce the log value.

16. The computing device of claim 15, wherein each of the plurality of coefficients is based on an expression having a form:

$$c = f^{(n)}(a)/n!$$

wherein c represents a coefficient, $f^{(n)}(a)$ represents an $n^{th}$ derivative of the logarithmic function, a represents the input value, and n is an integer.

17. The computing device of claim 15, wherein the input value is a binary value having a plurality of bits used to retrieve from the memory the ones of the plurality of coefficients.

18. The computing device of claim 15, wherein the logarithm converter further comprises:

means for subtracting a base point value from the input value to produce the interval value.

19. The computing device of claim 15, wherein the squaring means includes:

a square multiplier which produces the squared interval value in response to receiving the interval value.

20. The computing device of claim 15, wherein the squaring means includes:

a read-only-memory for producing the squared interval value in respond to receiving the interval value.

21. A method for generating an inverse-log value, which method comprises the following steps:

receiving an input value;

retrieving from a memory a plurality of coefficients based on a second-order Taylor polynomial that approximates an inverse-logarithmic function, the plurality of coefficients including a zero-order coefficient, a first-order coefficient, and a second-order coefficient;

subtracting a base point value from the input value to produce an interval value;

multiplying the interval value by the first-order coefficient to produce a first-order term;

squaring the interval value to produce a squared interval value;

multiplying the squared interval value by the second-order coefficient to produce a second-order term;

summing the first-order term and the second-order term to produce a first sum; and summing the first sum and the zero-order coefficient to produce the inverse-log value.

22. The method of claim 21, wherein the at least one coefficient is based on an expression having a form:

$$c = f^{(n)}(a)/n!$$

wherein c represents a coefficient value, $f^{(n)}$ (a) represents an $n^{th}$ derivative of the inverse-logarithmic function, a represents the input value, and n is an integer.

23. The method of claim 21, further comprising the following steps:

calculating a plurality of coefficients by using a Taylor polynomial to approximate the inverse-logarithmic function; and storing the plurality of the coefficients in the memory.

24. The method of claim 23, wherein the step of calculating includes the following substeps:

selecting a domain of input values for the inverse-logarithmic function;

selecting a plurality of base points within the domain; and for each of the base points, calculating a corresponding plurality of coefficients.

25. An inverse-logarithm converter, which comprises:

a memory for storing a plurality of coefficients that include a zero-order coefficient, a first-order coefficient, and a second-order coefficient, wherein the coefficients are based on a second-order Taylor polynomial which approximates an inverse-logarithmic function over a domain of input values;

a first multiplier for multiplying an interval value by the first-order coefficient to produce a first-order term;

means for squaring the interval value to produce a squared interval value;

a second multiplier for multiplying the squared interval value by the second-order coefficient to produce a second-order term;

a first adder for summing the first-order term and the second-order term to produce a first sum; and a second adder for summing the first sum and the zero-order coefficient to produce the inverse-log value.

26. The inverse-logarithm converter of claim 25, wherein each of the plurality of coefficients is based on an expression having a form:

$$c = f^{(n)}(a)/n!$$

wherein c represents a coefficient, $f^{(n)}$ (a) represents an $n^{th}$ derivative of the inverse-logarithmic function, a represents the input value, and n is an integer.

27. The inverse-logarithm converter of claim 25, further comprising:

means for subtracting a base point value from the input value to produce the interval value.

28. The inverse-logarithm converter of claim 27, wherein the squaring means includes:

a square multiplier which produces the squared interval value in response to receiving the interval value.

29. The inverse-logarithm converter of claim 27, wherein the squaring means includes:

a read-only-memory for producing the squared interval value in respond to receiving the interval value.

30. The inverse-logarithm converter of claim 25, wherein the input value is a binary value having a plurality of bits used to retrieve from the memory the ones of the plurality of coefficients.

31. An inverse-logarithm converter for generating an inverse-log value corresponding to an input value, the inverse-logarithm converter comprising:

a memory for storing a plurality of coefficient sets, wherein each of the coefficient sets is based on a second-order Taylor polynomial which approximates an inverse-logarithmic function at a base point within a domain of input values, the memory providing as output a coefficient set corresponding to the input value, wherein the coefficient set includes a zero-order coefficient, a first-order coefficient and a second-order coefficient;

a first multiplier for multiplying an interval value by the first-order coefficient to produce a first-order term;

a read-only-memory for producing a squared interval value in response to receiving the interval value;

a second multiplier for multiplying the squared interval value by the second-order coefficient to produce a second-order term;

a first adder for summing the first-order term and the second-order term to produce a first sum; and a second adder for summing the first sum and the zero-order coefficient to produce the inverse-log value.

32. The inverse-logarithm converter of claim 31, further comprising:

means for subtracting a base point value from the input value to produce the interval value.

33. The inverse-logarithm converter of claim 31, wherein the zero-order coefficient, the first-order coefficient, and the second-order coefficient are based on an expression having a form:

$$c = f^{(n)}(a)/n!$$

wherein c represents a coefficient, $f^{(n)}$ (a) represents an $n^{th}$ derivative of the inverse-logarithmic function, a represents the input value, and n is an integer.

34. The inverse-logarithm converter of claim 31, wherein the input value is a binary value having a plurality of bits used to retrieve the coefficient set from the memory.

35. A computing device, which comprises:

a processing unit for executing a computer operation which utilizes an inverse-log value;

a computer memory for storing a computer program which includes the computer operation;

an inverse-logarithm converter which receives an input value and includes:

a memory for storing a plurality of coefficients that include a zero-order coefficient, a first-order coefficient, and a second-order coefficient, wherein the coefficients are based on a second-order Taylor polynomial which approximates an inverse-logarithmic function over a domain of input values;

a first multiplier for multiplying an interval value by the first-order coefficient to produce a first-order term;

means for squaring the interval value to produce a squared interval value;

a second multiplier for multiplying the squared interval value by the second-order coefficient to produce a second-order term;

a first adder for summing the first-order term and the second-order term to produce a first sum; and a second adder for summing the first sum and the zero-order coefficient to produce the inverse-log value.

36. The computing device of claim 35, wherein each of the plurality of coefficients is based on an expression having a form:

$$c = f^{(n)}(a)/n!$$

wherein c represents a coefficient, $f^{(n)}$ (a) represents an $n^{th}$ derivative of the inverse-logarithmic function, a represents the input value, and n is an integer.

37. The computing device of claim 35, wherein the input value is a binary value having a plurality of bits used to retrieve from the memory the ones of the plurality of coefficients.

38. The computing device of claim 35, wherein the logarithm converter further comprises:

means for subtracting a base point value from the input value to produce the interval value.

39. The computing device of claim 35, wherein the squaring means includes:

a square multiplier which produces the squared interval value in response to receiving the interval value.

40. The computing device of claim 35, wherein the squaring means includes:

a read-only-memory for producing the squared interval value in respond to receiving the interval value.

* * * * *

UNITED STATES PATENT AND TRADEMARK OFFICE
CERTIFICATE OF CORRECTION

PATENT NO. : 5,604,691
DATED : February 18, 1997
INVENTOR(S) : James D. Dworkin et al.

It is certified that error appears in the above-indentified patent and that said Letters Patent is hereby corrected as shown below:

Col. 6, line 43, "squaring" should be --multiplying--.
Col. 6, line 45, "multiplying" should be --squaring--.

Signed and Sealed this

Ninth Day of September, 1997

Attest:

BRUCE LEHMAN

Attesting Officer

Commissioner of Patents and Trademarks